US010336361B2

(12) United States Patent
Olson et al.

(10) Patent No.: US 10,336,361 B2
(45) Date of Patent: Jul. 2, 2019

(54) VEHICLE ACCESSORY CONTROL CIRCUIT

(71) Applicant: Joyson Safety Systems Acquisition LLC, Auburn Hills, MI (US)

(72) Inventors: Corey Christopher Olson, Oxford, MI (US); Molly Kay Hengel, Washington, MI (US); John Christopher Bauer, Berkley, MI (US); Ryan Edward Jacewicz, Almont, MI (US); Edgar Fernando Garcia, Shelby Township, MI (US)

(73) Assignee: Joyson Safety Systems Acquisition LLC, Auburn Hills, MI (US)

( * ) Notice: Subject to any disclaimer, the term of this patent is extended or adjusted under 35 U.S.C. 154(b) by 151 days.

(21) Appl. No.: 15/478,945

(22) Filed: Apr. 4, 2017

(65) Prior Publication Data
US 2017/0282953 A1 Oct. 5, 2017

Related U.S. Application Data

(60) Provisional application No. 62/317,789, filed on Apr. 4, 2016.

(51) Int. Cl.
*B62D 1/04* (2006.01)
*B60K 35/00* (2006.01)
*H03K 17/96* (2006.01)

(52) U.S. Cl.
CPC .............. *B62D 1/046* (2013.01); *B60K 35/00* (2013.01); *H03K 17/962* (2013.01);
(Continued)

(58) Field of Classification Search
CPC ................................ B62D 1/046; B60K 35/00; B60K 2350/1028; H03K 2217/960765; H03K 17/962; H03K 17/9622
See application file for complete search history.

(56) References Cited

U.S. PATENT DOCUMENTS 3,585,626 A 6/1971 Tartarini
4,484,026 A 11/1984 Thornburg
(Continued)

FOREIGN PATENT DOCUMENTS

CN 102745231 10/2012
DE 202004020425 8/2005
(Continued)

OTHER PUBLICATIONS

Comeford, "Proximity Sensing Solutions, Part1: Capacitive Sensors", DigiKey Electronics, Sep. 19, 2013, 3 pages.
(Continued)

*Primary Examiner* — Jared Fureman
*Assistant Examiner* — Duc M Pham
(74) *Attorney, Agent, or Firm* — Meunier Carlin & Curfman LLC

(57) ABSTRACT

A vehicle accessory control circuit includes a processor electrically connected to a power source and a memory, the processor executing computer readable instructions stored on the memory to configure the accessory control circuit and an accessory control output. The control circuit includes at least one capacitive touch assembly having an electrically conductive conduit shielded by a portion of a steering mechanism of the vehicle. The capacitive touch assembly is connected to the power source and the processor such that the conduit is configured to transmit a capacitance input data signal to the processor to adjust the accessory control output. The capacitance input data signal is varied by a conductive touch object such as a human finger or palm to manipulate the output from the accessory system.

20 Claims, 11 Drawing Sheets

(52) U.S. Cl.
CPC .. *H03K 17/9622* (2013.01); *B60K 2350/1028* (2013.01); *H03K 2217/960765* (2013.01)

(56) References Cited

U.S. PATENT DOCUMENTS

| | | |
|---|---|---|
| 4,540,979 A | 9/1985 | Gerger et al. |
| 4,556,845 A | 12/1985 | Strope et al. |
| 4,631,976 A | 12/1986 | Noda et al. |
| 4,801,771 A | 1/1989 | Mizuguchi et al. |
| 4,929,934 A | 5/1990 | Ueda et al. |
| 5,398,962 A | 3/1995 | Kropp |
| 5,423,569 A | 6/1995 | Reighard et al. |
| 5,453,941 A | 9/1995 | Yoshikawa |
| 5,463,258 A | 10/1995 | Filion et al. |
| 5,539,259 A | 7/1996 | Filion et al. |
| 5,563,354 A | 10/1996 | Kropp |
| 5,793,297 A | 8/1998 | Takeuchi et al. |
| 5,871,063 A | 2/1999 | Young |
| 5,914,658 A | 6/1999 | Arakawa |
| 5,964,478 A | 10/1999 | Stanley et al. |
| 5,965,952 A | 10/1999 | Podoloff et al. |
| 6,016,103 A | 1/2000 | Leavitt |
| 6,172,610 B1 | 1/2001 | Prus |
| 6,239,409 B1 | 5/2001 | Bonn |
| 6,326,593 B1 | 12/2001 | Bonn |
| 6,333,736 B1 | 12/2001 | Sandbach |
| 6,365,875 B1 | 4/2002 | Kreuzer |
| 6,378,384 B1 | 4/2002 | Atkinson et al. |
| 6,392,542 B1 | 5/2002 | Stanley |
| 6,495,799 B1 | 12/2002 | Pillsbury |
| 6,501,463 B1 | 12/2002 | Dahley et al. |
| 6,590,499 B1 | 7/2003 | D'Agosto |
| 6,661,345 B1 | 12/2003 | Bevan |
| 6,703,845 B2 | 3/2004 | Stanley et al. |
| 6,906,700 B1 | 6/2005 | Armstrong |
| 6,918,610 B2 | 7/2005 | Song et al. |
| 7,126,583 B1 | 10/2006 | Breed |
| 7,321,311 B2 | 1/2008 | Rieth |
| 7,649,278 B2 | 1/2010 | Yoshida |
| 7,687,747 B2 | 3/2010 | Lee |
| 7,688,213 B2 | 3/2010 | Power |
| 7,830,265 B2 | 11/2010 | Power |
| 7,908,941 B2 | 3/2011 | Menaldo |
| 7,928,341 B2 | 4/2011 | Ito et al. |
| 8,011,234 B2 | 9/2011 | Kandler |
| 8,095,270 B2 | 1/2012 | Bossler et al. |
| 8,203,454 B2 | 6/2012 | Knight et al. |
| 8,214,105 B2 | 7/2012 | Daly et al. |
| 8,269,731 B2 | 9/2012 | Molne |
| 8,461,957 B2 | 6/2013 | Haag |
| 8,564,424 B2 | 10/2013 | Evarts et al. |
| 8,698,764 B1 | 4/2014 | Karakotsios et al. |
| 8,952,907 B2 | 2/2015 | Brown et al. |
| 8,970,231 B2 | 3/2015 | Kandler |
| 8,970,232 B2 | 3/2015 | Kandler |
| 8,983,732 B2 | 3/2015 | Lisseman et al. |
| 9,007,190 B2 | 4/2015 | Bosch et al. |
| 9,248,851 B2 | 2/2016 | Van'tZelfde et al. |
| 9,266,454 B2 | 2/2016 | Barfuss |
| 9,346,480 B2 | 5/2016 | Maguire |
| 9,643,560 B2 | 5/2017 | Honmatsu et al. |
| 2001/0030182 A1 | 10/2001 | Haag |
| 2002/0054060 A1 | 5/2002 | Schena |
| 2002/0080014 A1 | 6/2002 | McCarthy |
| 2003/0043014 A1 | 3/2003 | Nakazawa et al. |
| 2003/0074092 A1 | 4/2003 | Carrabis |
| 2003/0076968 A1 | 4/2003 | Rast |
| 2003/0083131 A1 | 5/2003 | Armstrong |
| 2003/0111453 A1 | 6/2003 | Haag et al. |
| 2004/0144197 A1 | 7/2004 | O'Grady |
| 2004/0155020 A1 | 8/2004 | Worrell |
| 2004/0212189 A1 | 10/2004 | Kachu |
| 2004/0267422 A1 | 12/2004 | Bossier et al. |
| 2005/0052426 A1* | 3/2005 | Hagermoser ........ B60K 35/00 345/173 |
| 2005/0067889 A1 | 3/2005 | Chernoff et al. |
| 2005/0260492 A1 | 11/2005 | Tucholski et al. |
| 2005/0273218 A1 | 12/2005 | Breed et al. |
| 2006/0025897 A1 | 2/2006 | Shostak et al. |
| 2006/0054479 A1 | 3/2006 | Iisaka et al. |
| 2006/0066085 A1 | 3/2006 | Durocher |
| 2006/0109256 A1 | 5/2006 | Grant et al. |
| 2006/0113880 A1 | 6/2006 | Pei et al. |
| 2006/0177212 A1 | 8/2006 | Lamborghini et al. |
| 2006/0231320 A1 | 10/2006 | Kamizono et al. |
| 2006/0248478 A1 | 11/2006 | Liau |
| 2006/0262103 A1 | 11/2006 | Hu et al. |
| 2006/0284839 A1 | 12/2006 | Breed et al. |
| 2007/0029768 A1 | 2/2007 | Clos et al. |
| 2007/0062753 A1 | 3/2007 | Yoshida et al. |
| 2007/0100523 A1 | 5/2007 | Trachte |
| 2007/0187134 A1 | 8/2007 | Detian |
| 2007/0210050 A1 | 9/2007 | Choi |
| 2007/0278214 A1 | 12/2007 | Weiss |
| 2008/0042856 A1 | 2/2008 | Power |
| 2008/0079604 A1 | 4/2008 | Madonna et al. |
| 2008/0085021 A1 | 4/2008 | Shim |
| 2008/0202912 A1 | 8/2008 | Boddie et al. |
| 2008/0210048 A1 | 9/2008 | Yoneyama et al. |
| 2009/0001855 A1 | 1/2009 | Lipton et al. |
| 2009/0032524 A1 | 2/2009 | Li |
| 2009/0140994 A1* | 6/2009 | Tanaka ........ H01H 13/83 345/173 |
| 2009/0151447 A1 | 6/2009 | Jin et al. |
| 2009/0160529 A1 | 6/2009 | Lamborghini et al. |
| 2009/0241378 A1 | 10/2009 | Ellis |
| 2010/0045454 A1 | 2/2010 | Knight et al. |
| 2010/0045612 A1 | 2/2010 | Moline |
| 2010/0053087 A1 | 3/2010 | Dai et al. |
| 2010/0071502 A1 | 3/2010 | Yasuda |
| 2010/0096159 A1 | 4/2010 | Abe |
| 2010/0102972 A1 | 4/2010 | Middlekauff et al. |
| 2010/0130808 A1 | 5/2010 | Hattori |
| 2010/0168998 A1 | 7/2010 | Matsunaga |
| 2010/0200268 A1 | 8/2010 | Suzuki |
| 2010/0231239 A1 | 9/2010 | Tateishi et al. |
| 2010/0250071 A1 | 9/2010 | Pala et al. |
| 2010/0268426 A1* | 10/2010 | Pathak ........ G06F 3/03547 701/48 |
| 2010/0277186 A1 | 11/2010 | Bieck et al. |
| 2010/0315267 A1 | 12/2010 | Chung et al. |
| 2011/0001722 A1* | 1/2011 | Newman ........ G06F 3/03547 345/174 |
| 2011/0016868 A1 | 1/2011 | Oda |
| 2011/0037721 A1 | 2/2011 | Cranfill et al. |
| 2011/0046788 A1 | 2/2011 | Daly et al. |
| 2011/0054359 A1 | 3/2011 | Sazonov et al. |
| 2011/0073384 A1 | 3/2011 | Osoinach |
| 2011/0115617 A1 | 5/2011 | Bennett |
| 2011/0133919 A1 | 6/2011 | Evarts et al. |
| 2011/0175844 A1 | 7/2011 | Berggren |
| 2011/0189890 A1 | 8/2011 | Lee et al. |
| 2011/0210926 A1 | 9/2011 | Pasquero et al. |
| 2011/0216015 A1 | 9/2011 | Edwards |
| 2011/0241850 A1 | 10/2011 | Bosch et al. |
| 2011/0245992 A1 | 10/2011 | Stahlin et al. |
| 2011/0246028 A1* | 10/2011 | Lisseman ........ B60K 28/066 701/45 |
| 2011/0257846 A1 | 10/2011 | Bennett |
| 2011/0290038 A1 | 12/2011 | Hoshino et al. |
| 2012/0038468 A1 | 2/2012 | Provancher |
| 2012/0126965 A1 | 5/2012 | Sanma et al. |
| 2012/0179328 A1* | 7/2012 | Goldman-Shenhar ........ B62D 1/046 701/36 |
| 2012/0232751 A1 | 9/2012 | Guspan |
| 2012/0296528 A1 | 11/2012 | Wellhoefer et al. |
| 2012/0306512 A1 | 12/2012 | Kandler |
| 2012/0326735 A1* | 12/2012 | Bennett ........ B62D 1/046 324/705 |
| 2013/0003451 A1 | 1/2013 | Bedeschi et al. |
| 2013/0009654 A1 | 1/2013 | Kandler et al. |
| 2013/0027065 A1 | 1/2013 | Stanley et al. |
| 2013/0098890 A1 | 4/2013 | Virnich |

(56) References Cited

U.S. PATENT DOCUMENTS

| | | |
|---|---|---|
| 2013/0120052 A1 | 5/2013 | Siska |
| 2013/0277351 A1 | 10/2013 | Lamesch |
| 2014/0054880 A1 | 2/2014 | Feinstein |
| 2014/0076063 A1 | 3/2014 | Lisseman et al. |
| 2014/0092025 A1 | 4/2014 | Pala et al. |
| 2014/0110388 A1 | 4/2014 | Fassbender et al. |
| 2014/0151356 A1 | 6/2014 | Maquire et al. |
| 2014/0224040 A1 | 8/2014 | Van'tZelfde et al. |
| 2014/0246415 A1 | 9/2014 | Wittkowski et al. |
| 2014/0326708 A1 | 11/2014 | Barfuss et al. |
| 2014/0331815 A1 | 11/2014 | Rispoli et al. |
| 2015/0028015 A1 | 1/2015 | Park et al. |
| 2015/0048845 A1 | 2/2015 | Petereit et al. |
| 2015/0054317 A1 | 2/2015 | Fortune et al. |
| 2015/0177204 A1 | 6/2015 | Bessen et al. |
| 2015/0205421 A1 | 7/2015 | Lin et al. |
| 2015/0345998 A1 | 12/2015 | Lamesch et al. |
| 2015/0369633 A1 | 12/2015 | Karasawa et al. |
| 2016/0038009 A1 | 2/2016 | Khait et al. |
| 2016/0375910 A1 | 12/2016 | McMillen et al. |

FOREIGN PATENT DOCUMENTS

| | | |
|---|---|---|
| DE | 102009058138 | 6/2006 |
| DE | 102007024141 | 11/2008 |
| DE | 102011006448 | 10/2011 |
| DE | 102012000572 | 7/2013 |
| DE | 102012000572 A1 | 7/2013 |
| DE | 102005024432 | 10/2016 |
| JP | 61-146671 | 7/1986 |
| JP | S61-146670 | 9/1986 |
| JP | H09 226597 | 9/1997 |
| JP | 2000 228126 | 8/2000 |
| JP | 2007114122 | 5/2007 |
| JP | 2008-059459 | 3/2008 |
| JP | 2010-026610 | 2/2010 |
| JP | 2011063103 | 3/2011 |
| JP | 2011 219085 | 11/2011 |
| JP | 2013 505865 | 2/2013 |
| WO | 2011/016868 | 10/2011 |

OTHER PUBLICATIONS

Final Office Action issued is U.S. Appl. No. 14/728,366, dated May 25, 2017.
Non-final Office Action issued in U.S. Appl. No. 14/728,366, dated Nov. 21, 2016.
International Search Report and Written Opinion issued in PCT/US15/33708, dated Sep. 2, 2015.
International Preliminary Report on Patentability issued in PCT/US15/33708, dated Dec. 15, 2016.
International Search Report and Written Opinion issued in PCT/US15/032116 dated Aug. 28, 2015.
International Search Report and Written Opinion issued in PCT/US14/016023, dated May 23, 2014.
International Preliminary Report on Patentability issued in PCT/US14/016023, dated Aug. 18, 2015.
Office Action, dated Jun. 30, 2015, received in JP Application No. 2011-082736 (English).
Office Action, dated Nov. 4, 2014, received in JP Application No. 2011-082736 (English).
U.S. Appl. No. 14/178,578, filed Feb. 12, 2014.
Notice of Allowance, dated Sep. 25, 2015, in U.S. Appl. No. 14/178,578, filed Feb. 12, 2014.
Non-Final Office Action in U.S. Appl. No. 14/178,578 dated May 11, 2015.
U.S. Appl. No. 13/078,793, filed Apr. 1, 2011 (U.S. Pat. No. 8,983,732, issued Mar. 17, 2015).
Notice of Allowance, dated Nov. 3, 2014, received in connection with U.S. Appl. No. 13/078,793.
U.S. Appl. No. 13/078,793, filed Apr. 1, 2011 (U.S. Pat. No. 8,983,732, dated Mar. 17, 2015).
Final Office Action in U.S. Appl. No. 13/078,793 dated May 6, 2014.
Non-Final Office Action in U.S. Appl. No. 13/078,793 dated Dec. 16, 2013.
Non-Final Office Action in U.S. Appl. No. 13/078,793 dated Dec. 6, 2012.
Final Office Action in U.S. Appl. No. 13/078,793 dated Jun. 3, 2013.
Final Office Action in U.S. Appl. No. 13/078,793 dated Mar. 15, 2013.
U.S. Appl. No. 13/076,226, filed Mar. 30, 2011 (U.S. Pat. No. 9,007,190, issued Apr. 14, 2015).
Supplemental Notice of Allowance, dated Feb. 20, 2015, received in connection with U.S. Appl. No. 13/076,226.
Notice of Allowance, dated Dec. 23, 2014, received in connection with U.S. Appl. No. 13/076,226.
Non-Final Office Action in U.S. Appl. No. 13/076,226 dated Sep. 11, 2014.
Final Office Action in U.S. Appl. No. 13/076,226 dated Feb. 13, 2014.
Non-Final Office Action in U.S. Appl. No. 13/076,226 dated Mar. 11, 2013.
U.S. Appl. No. 14/728,366, filed Jun. 2, 2015.
International Preliminary Report on Patentability dated Apr. 22, 2014 in PCT/EP2012/070777.
"Modellierung and Realisierung eines digitalen Tragerfrequenzmesssystems zur Messung von kapazitiven Sensoren im Umfeld einer Ultraprazisionsdrehmaschine" Dipl.- Ing. Jonas Bluth aus Rutesheim. "Modeling and realization of a digital Carrier frequency measuring system for the measurement of capacitive sensors in the Environment of an ultra-precision turning machine—Dissertation by Jonas Bluth—English abstract included.".
Office Action issued in co-pending U.S. Appl. No. 14/353,109, dated Apr. 21, 2016.
Office Action issued in co-pending U.S. Appl. No. 14/353,109, dated Sep. 15, 2016.
Non-Final Office Action issued in U.S. Appl. No. 14/353,109, dated Feb. 23, 2017.
Office Action issued in Chinese Application No. 201480008587.9, dated Oct. 9, 2016. English translation included.
International Preliminary Report on Patentability dated Dec. 1, 2016 in PCT/US15/032116.
International Search Report and Written Opinion dated Dec. 27, 2017, issued for International Application No. PCT/US2017/044375.

* cited by examiner

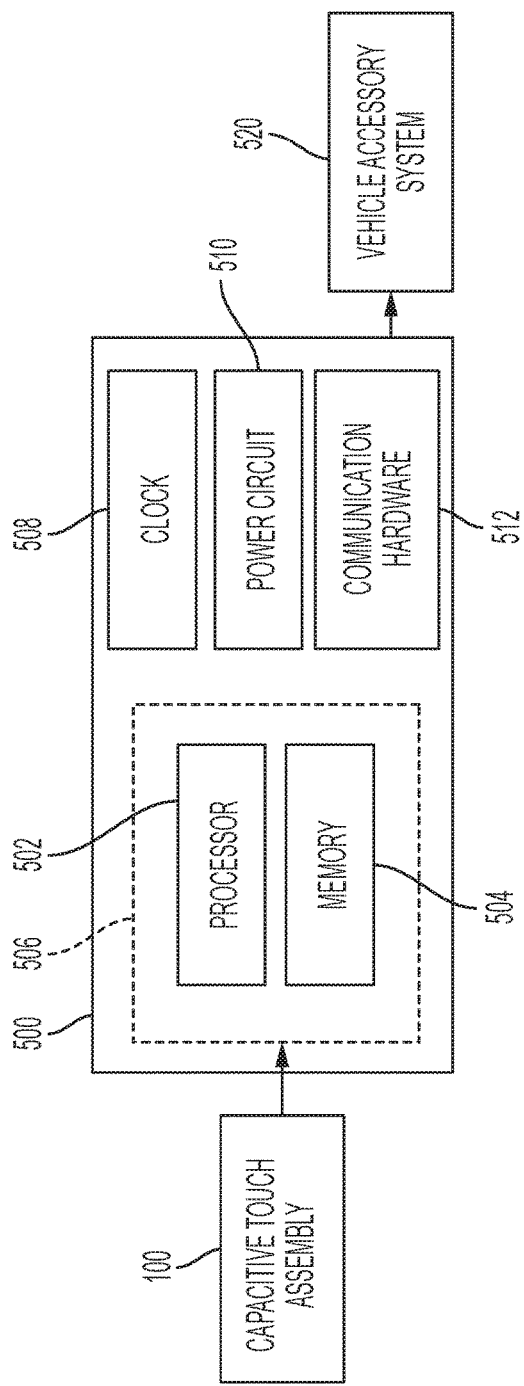
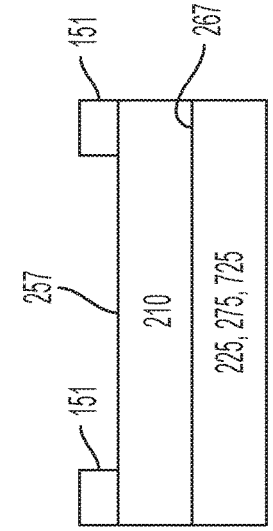
FIG. 15A
FIG. 15B
FIG. 15C

VEHICLE ACCESSORY CONTROL CIRCUIT

CROSS REFERENCE TO RELATED APPLICATIONS

This application claims priority to and incorporates entirely by reference the previously filed Provisional Patent Application currently pending as U.S. Ser. No. 62/317,789 filed on Apr. 4, 2016 and entitled Vehicle Accessory Control Circuit.

FIELD OF THE INVENTION

The disclosure herein relates to the field of vehicle systems controlled by the driver via control panels accessible while operating the vehicle. In particular, the concepts embodied in this description relate to controlling accessory systems, such as a vehicle horn, from a control circuit accessible on the steering mechanism of the vehicle.

BACKGROUND

Vehicles currently incorporate numerous control switches into a steering wheel area of a vehicle to give the driver a safe and convenient way to manipulate various vehicle systems while driving. These systems include, but are not limited to, a horn output, a windshield wiper system, a cruise control system, an audio system, a video system, and/or a lighting system. Control panels for these kinds of systems currently utilize various push button and toggle switch circuitry installations installed onto a steering wheel mechanism of the vehicle and may be configured for installation alongside a driver air bag module, a cover for the driver air bag, or along any other portion of a steering assembly within a vehicle.

For example, the driver air bag module may be secured onto a frame of a hub of a steering wheel in the vehicle. The driver air bag module may include an electrical contact that completes an electrical circuit of a horn system, or other vehicle accessory systems. Using a commonly known vehicle horn as one non-limiting example of current technology, the steering mechanism in most vehicles allows for horn actuation when the air bag module is moved toward a corresponding electrical contact on the steering wheel frame. Typically, the contact on the driver air bag module is biased away from the contact on the steering wheel frame using springs, and the vehicle operator must push the driver air bag module with sufficient force to overcome the biasing force of the springs. The horn signal produced by completing the circuit is an on/off signal. In addition, depending on the location and number of the contacts, the force required to actuate the horn in the center of the driver air bag module may be higher than the force required to actuate the horn from the periphery of the driver air bag module. Furthermore, the horn may be actuated inadvertently if the vehicle is subjected to vibration, such as off road conditions.

Other well-known vehicle accessory systems operated from the steering mechanism of a vehicle include the lighting system, windshield wipers, cruise control, Bluetooth® systems, stereo systems, and the like. These systems also incorporate electro-mechanical switches, potentiometers, or other hardware to physically manipulate a respective output signal.

Drivers today, however, expect high levels of convenience, durability, and aesthetic appeal in the driver's area of new vehicles. Traditional gauges, buttons, dials, switches, and common hardware used in vehicles are outdated as more individuals are accustomed to the convenience of technology incorporated into personal devices, such as smart phones, tablets, and personal computers. Given the fast paced nature of these personal devices, there is a need in the art for an improved way to give drivers access to vehicle systems from the driver's seat of a vehicle while simultaneously allowing the drivers the familiarity of modern computing technology.

Accordingly, there is a need in the art for more convenient and user friendly control panels for vehicle control circuits, particularly for drivers utilizing accessories available in modern automobiles.

BRIEF SUMMARY OF THE INVENTION

In one embodiment, a vehicle accessory control circuit may include a processor electrically connected to a power source and a memory, the processor executing computer readable instructions stored on the memory to configure the accessory control circuit and an accessory control output. The control circuit includes at least one capacitive touch assembly having an electrically conductive conduit shielded by a portion of a steering mechanism of the vehicle. The capacitive touch assembly is connected to the power source and the processor such that the conduit is configured to transmit a capacitance input data signal to the processor to adjust the accessory control output.

In another embodiment, the vehicle accessory control circuit includes a processor electrically connected to a power source and a memory, the processor executing computer readable instructions stored on the memory to configure the accessory control circuit and an accessory control output. The control circuit includes at least one capacitive touch assembly coupled to a steering mechanism of the vehicle, the capacitive touch assembly including a polymer layer and an electrically conductive conduit at least partially encased within the polymer layer and connected at opposite ends to the power source and the processor such that said conduit transmits a capacitance input data signal to the processor to adjust the accessory control output.

In a third embodiment, the vehicle accessory control circuit includes a processor connected to a power source and a memory, the processor executing computer readable instructions stored on the memory to configure the accessory control circuit. The circuit incorporates at least one capacitive touch assembly coupled to a steering mechanism of the vehicle, the capacitive touch assembly transmitting a capacitance input data signal to the processor. In this embodiment, the capacitive touch assembly utilizes an additional touch layer extending over at least one conductive layer, such that the touch layer is exposed on an outer surface opposite the conductive layer. The conductive layer is in electronic communication with the power source and the processor and conducts the capacitance input data signal from the capacitive touch assembly to the processor to adjust an accessory control output.

In yet another embodiment, the vehicle accessory control circuit is part of a vehicle accessory actuation system. A vehicle accessory control circuit connects a vehicle accessory to a power source, a processor, and a memory, wherein the processor executes computer readable instructions stored on the memory to configure the vehicle accessory control circuit and a vehicle accessory output. The circuit includes at least one capacitive touch assembly coupled to a steering mechanism of the vehicle and transmits a capacitance input data signal to the processor, wherein the capacitive touch assembly includes a touch layer having a first side and an exposed side and at least one conductive layer coupled to the first side of the touch layer and in electronic communication with the power source and the processor. The conductive layer transmits a capacitance input data signal to the processor to adjust the vehicle accessory output. In this embodiment, an air bag module may be coupled to the steering mechanism, the air bag module having a cover disposed within the perimeter of the steering mechanism, and the at least one capacitive touch assembly is disposed on the steering mechanism adjacent the cover.

BRIEF DESCRIPTION OF THE FIGURES

FIG. 15A is a schematic figure of a control circuit and associated hardware as described herein.

FIG. 15B is a cross section of a capacitive touch assembly as shown herein with a selection of conductive layers and a touch layer.

FIG. 15C is a cross section of a capacitive touch assembly as shown herein with a selection of conductive layers, a touch layer within the capacitive touch assembly, and an external shielding layer atop both.

DETAILED DESCRIPTION

Figure 1:
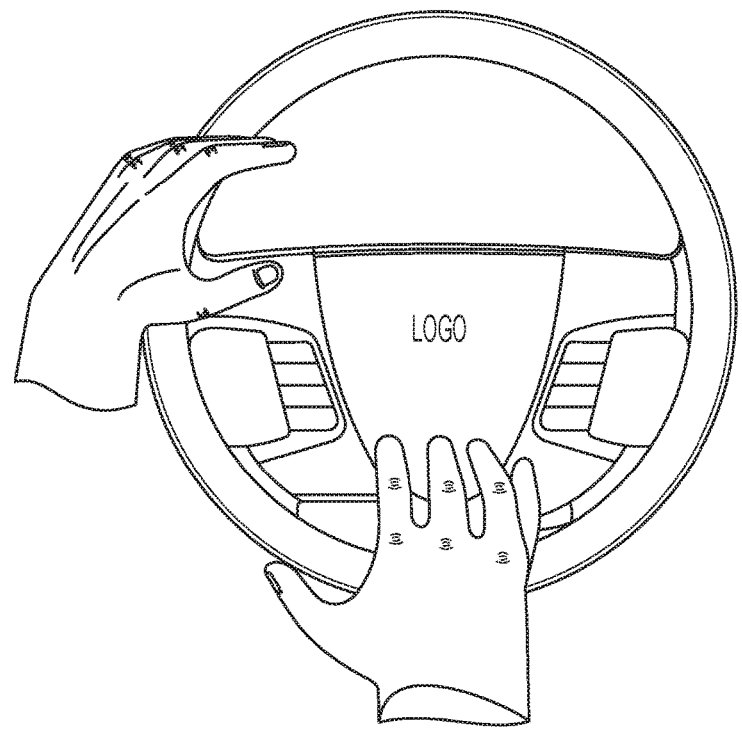
FIG. 1 is a prior art steering mechanism with control buttons and a mechanical horn.

Various implementations are directed to an improved vehicle accessory control system for use in a vehicle. These systems include, without limiting this disclosure to any particular embodiment, a horn output, a windshield wiper system, a cruise control system, an audio system, a video system, or a lighting system. Control panels for these kinds of systems may utilize various circuitry installations connected onto a steering wheel mechanism of the vehicle and may be configured for installation alongside a driver air bag module, a cover for the driver air bag, or along any other portion of a steering assembly within a vehicle.

The vehicle accessory control circuit and associated system described herein includes one or more capacitive touch assemblies (100) incorporating an electrically conductive conduit therein. The capacitive touch assembly (100) may be configured for access via an overall steering mechanism (110) of a vehicle and is positioned on or within the steering mechanism to allow a touch object (150) to come into contact or close proximity to an exposed surface of the steering mechanism (110) and the capacitive touch assembly (100). The touch object (150) may be an electrically conductive object, including but not limited to, a human hand, palm, finger, or the like, that adjusts a capacitance response in the electrically conductive conduit (175) positioned in the capacitive touch assembly (100).

Certain terms are used in this disclosure according to their broadest interpretation. For example, a "capacitive touch assembly" is a term used to encompass all embodiments of the structures disclosed herein that exhibit a capacitive response upon excitation with a power source in a circuit. The "capacitive touch assembly" includes those structures described herein that have a differential capacitive response when a touch object (150) is in sufficient proximity or touching a surface of the capacitive touch assembly.

A "conductive layer" is used to describe any structure that provides the requisite conductivity within the capacitive touch assembly and is not limited to planar structures. The conductive layer may include, but is not limited to, a simple conductive conduit such as a wire (175) or wire mesh, or conductive elements encased in a polymeric layer. The conductive layer may be a film (FIG. 5) that includes carbon nanobuds and carbon nanotubes in a polymeric fabric, or it may be any surface of any kind that has a conductive quality via a coating, a conduit, a printed circuit or numerous other conductive elements.

A "capacitance input data signal" can be any data input used by a processor (502) to assess change in capacitance at points along the conductive layer or conduit. In one example, a controller measures capacitance directly, and that value is sent to the processor (502) when capacitance has been altered by a touch object (150).

Along these lines, a "touch object" (150) can be a human hand or any conductive item used to change capacitance about the conductor (175) described herein.

Certain embodiments of this disclosure optionally have a distinct "touch layer" (300) that may be a particularly designed layer of a capacitive touch assembly or may be a simple steering wheel leather, plastic, or skin positioned over a conductor exhibiting a capacitive response in the assembly.

The term "vehicle" as used herein has its broadest plain meaning for machines that can be driven and controlled in line with the purposes of this disclosure.

Figure 2A:
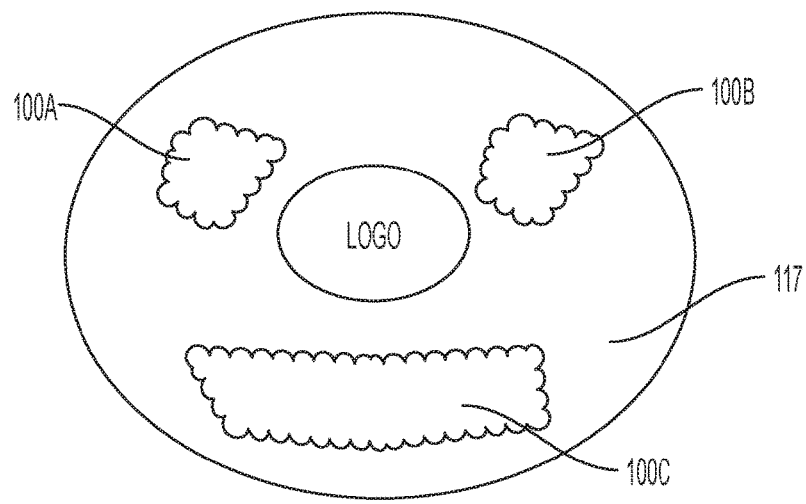
FIG. 2A is a front plan view of a steering mechanism according to one embodiment of this disclosure utilizing a capacitive touch assembly to control at least one vehicle accessory system.
Figure 2B:
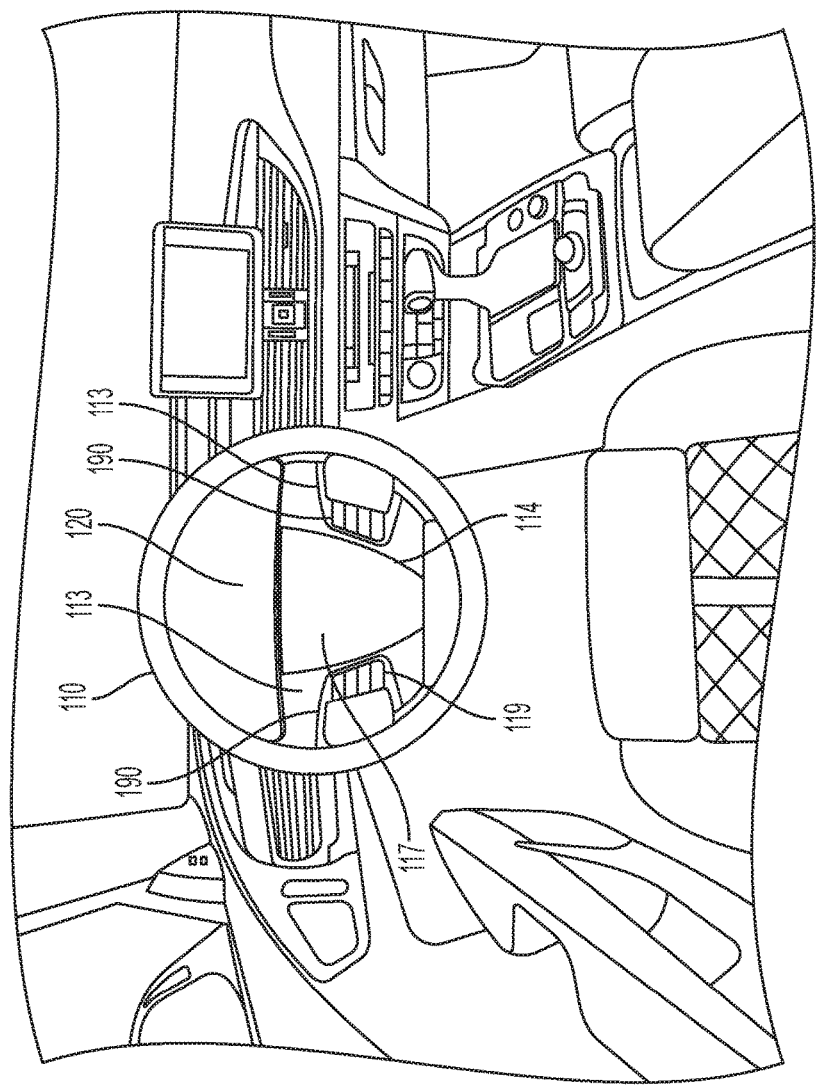
FIG. 2B is a front plan view of a steering mechanism according to one embodiment of this disclosure.

Use of terms "remote", "proximate", "front" and "rear" are from the perspective of a user sitting in a driver's seat of a vehicle encompassing a steering mechanism as shown in FIG. 2B.

Certain embodiments of this disclosure describe "adjusting" values for either capacitance in a circuit, a capacitance input data signal, a vehicle accessory control circuit, or other outputs. The term "adjust" is given its broadest plain meaning, including but not limited to, changing a measurable value for a physical phenomenon such as capacitance, changing, either by increasing or decreasing, an output amplitude or data value, or by increasing and/or decreasing direction, intensity, amplitude, frequency or any other characteristic of a signal at issue.

FIG. 2B illustrates a plan view of an exemplary steering mechanism implementing an improved vehicle accessory control circuit as described herein. The term "steering mechanism" (110) as used herein includes all aspects of any component related to steering a vehicle and accessible by a person inside the vehicle, such as but not limited to, a vehicle driver. A steering mechanism (110) is any component of the steering function in a vehicle that is accessible from inside a vehicle and includes, but is not limited to, a steering grip (112), spokes (113), and a hub (114). A steering wheel bezel (117) provides a framework for holding the components of a steering mechanism, such as an emblem, an air bag cover (130), and the various control features (119) along the spokes (113). The steering grip (112) can be shaped in such a way to facilitate a driver's control of a vehicle when holding the steering grip (112). For example, the steering grip (112) shown in FIG. 2B has an annular ring shape with an outer contour that is essentially circular in shape. However, in other implementations, the steering grip can define any suitable shape including, for example, circular, elliptical, square, rectangular, or any other regular or irregular shape. Furthermore, in other implementations, the steering grip can include a single continuous grip portion or any number of unique grip sections.

The steering grip (112) can be coupled to the hub (114) via spokes (113) integrated within a framework provided by a steering wheel bezel (117), and the hub (114) can be mounted on a fixed component of the vehicle such that the steering grip (112), spokes (113), and hub (114) can be rotationally moved about a steering axis. An exemplary fixed component can include, for example, a steering column, which receives a steering spindle that extends along the steering column and serves to transmit the rotational movement of the steering grip (112) to the wheels of the motor vehicle. Rotational movement of the steering grip (112) may be transmitted to the wheels by mechanical and/or electrical means.

Figure 14:
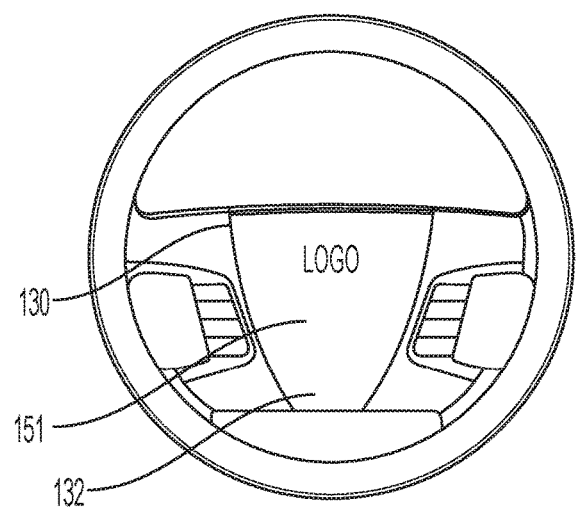
FIG. 14 is a front plan view of a driver air bag cover as described herein with defined tear seams forming perimeters of zones for capacitive touch assemblies.

In many vehicles, a driver air bag module (120) is operably coupled to the steering hub (114) and enclosed with a driver air bag cover (130). An exemplary implementation of the driver air bag module (120) is shown in FIG. 14 of this disclosure, illustrating an air bag cover (130) defining tear seams (133) that rip during air bag deployment. As shown, the driver air bag module (120) may include a base plate (132) within the steering mechanism (110) and a cover (130). The base plate (132) is configured for being coupled to the hub (114) of the steering mechanism and may be stationary with respect to the hub (114) upon installation. A driver air bag and inflator are often disposed adjacent a central portion of an outer surface of the base plate (132).

The embodiments of this disclosure allow a driver, or one in the vehicle with sufficient access to the steering mechanism (110), to control numerous vehicle accessory systems via control circuitry installed about the steering mechanism (110) of a vehicle. As noted above, the accessory systems may include a horn output, lighting, audio outputs, climate control, and numerous other vehicle accessories requiring control system input while a person is inside the vehicle. One aspect of the products, methods and systems described herein is that the accessory control may be accomplished via touch surfaces (FIG. 15B, Ref. 157; FIG. 15C, Ref. 257) on or about the steering mechanism (110) of a vehicle. This allows a user to operate the vehicle control systems in a way that is familiar to the user who already operates many personal devices via touch surfaces.

The touch sensor assembly (FIG. 2B, Ref. 190) would replace standard buttons, dials, and gauges of the prior art but still be conveniently located along the steering mechanism (110) in the vehicle. In one embodiment, the touch sensor assemblies (190) of FIG. 2B are smooth to the touch and are positioned along a steering wheel bezel (117) for convenient access. In this regard, the touch sensor assemblies (190) are accessible like standard buttons but are more durable and more precisely operated as touch sensor buttons along the bezel (117) of the steering mechanism (110) (as shown for example in FIG. 3) instead of mechanically actuated buttons of the prior art.

Figure 3:
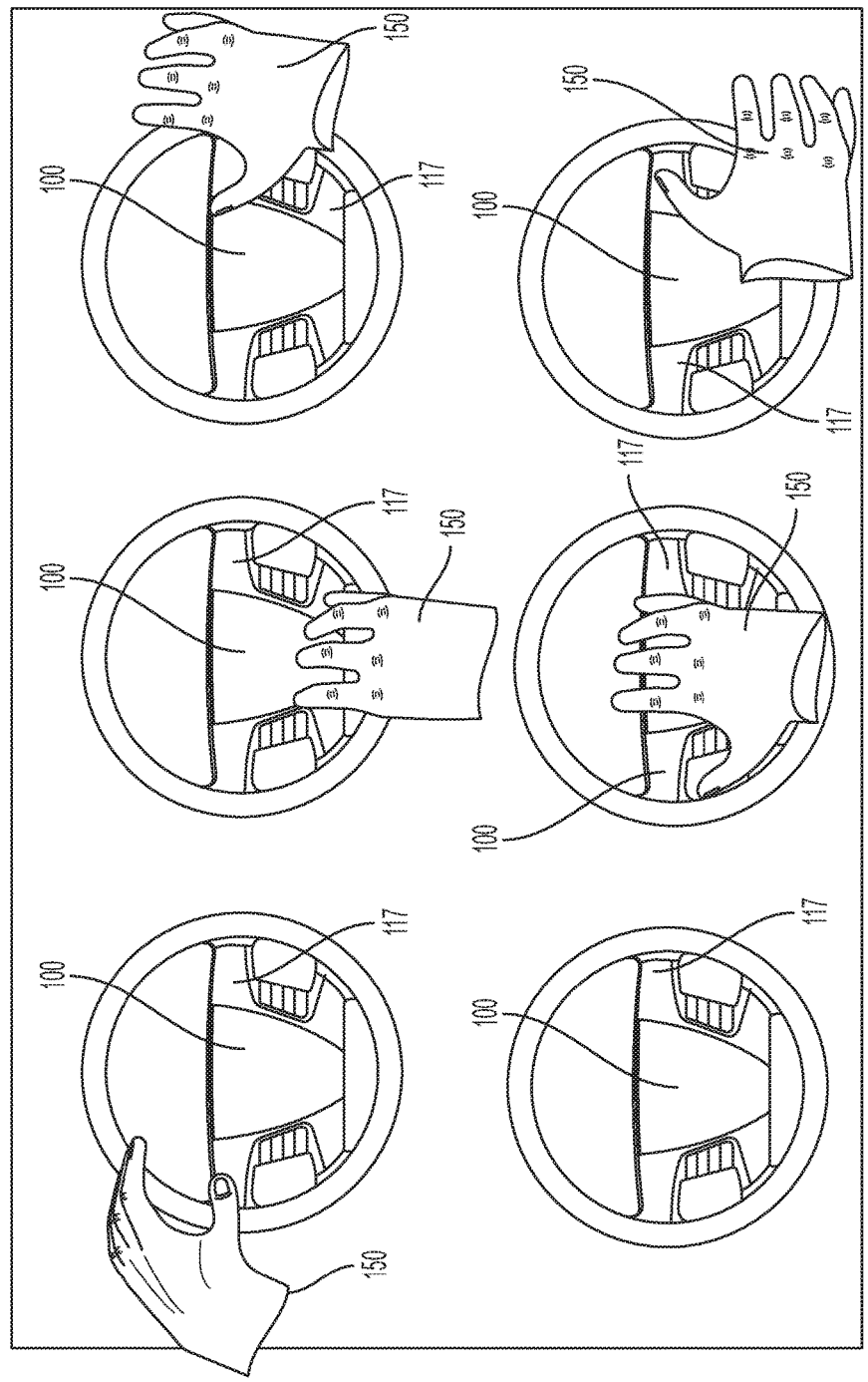
FIG. 3 is a front plan view of a steering mechanism according to this disclosure incorporating zones for a touch object in the form of a human hand to access a capacitive touch assembly as described herein.

FIG. 15A shows an overall computerized system embodiment utilizing the capacitive touch assembly (100) disclosed herein in conjunction with associated electronics (500). The processor (502) provides avenues for accessory system outputs to be tailored to particular needs and particular inputs. One non-limiting example of a particular output can be illustrated by a horn system as the accessory to consider. In the prior art, as shown in prior art FIG. 1, a horn system is mechanically actuated and either on or off. The user physically determines the timing and duration of a horn output by maintaining physical contact with an input sensor. Instead, with the control circuit described herein and shown implemented in FIG. 3, a processor (502) in data communication with a capacitive touch assembly (100) may be programmed for a particular output depending on numerous factors regarding a user accessing the capacitive touch assembly (100) with the above described touch object (150) (e.g., a finger or hand). As illustrated in FIG. 3F, the capacitive touch assembly may be divided into sections (116A, 116B, 116C, 116D), and depending on the location at which the user touches the steering mechanism (110) and an associated capacitive touch assembly (100) therein, the processor may provide a pre-set output. For example, a user may initiate a short "courtesy toot" of the horn by touching one area of the steering mechanism (110) with a single finger as in FIGS. 3A, 3C, or 3E, or the user may send an emergency horn output (i.e., "sit on the horn") via a different touch configuration (i.e., the whole palm touching the sensor in FIG. 3D). FIG. 3B illustrates an example in which the horn is presented with an emergency sound, for example. The kinds of accessory outputs may depend on the zone in which a user touches the steering mechanism, the timing of the touch, or the kind of touch object used (i.e., a thumb, a palm, or whole hand). All of these inputs are also subject to customized programming in the circuit software of FIG. 15A.

Figure 5:
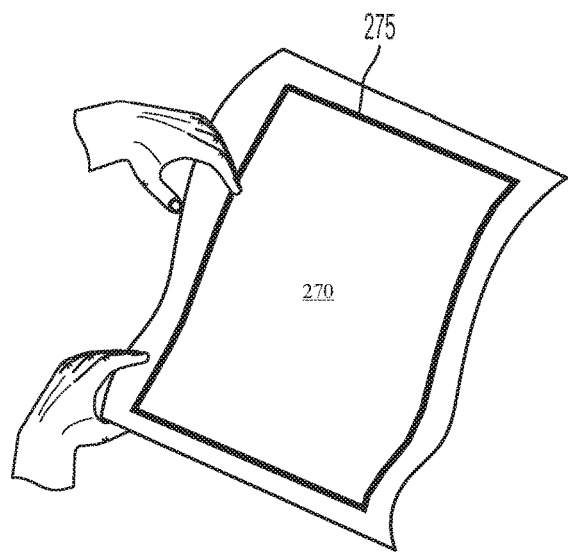
FIG. 5 is a perspective view of a conductive layer according to one embodiment of this invention for use in a capacitive touch assembly described herein.
Figure 6:
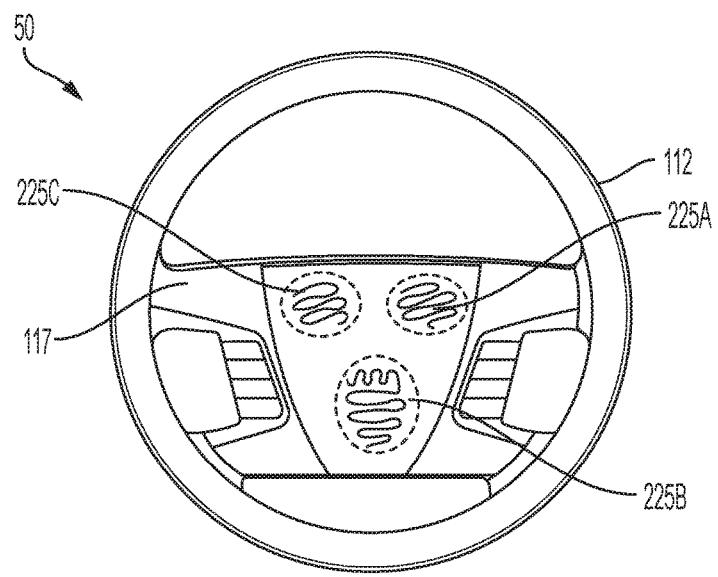
FIG. 6 is a front plan view of a steering mechanism as described herein incorporating a conductor defining respective capacitive touch zones for controlling respective vehicle accessory system outputs.
Figure 12:
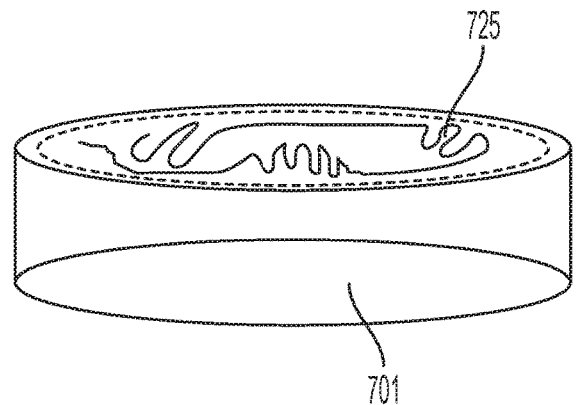
FIG. 12 is a top perspective view of another mold used for injection molding a rear surface of a component of a steering mechanism and having a conductive conduit therein.
Figure 13A:
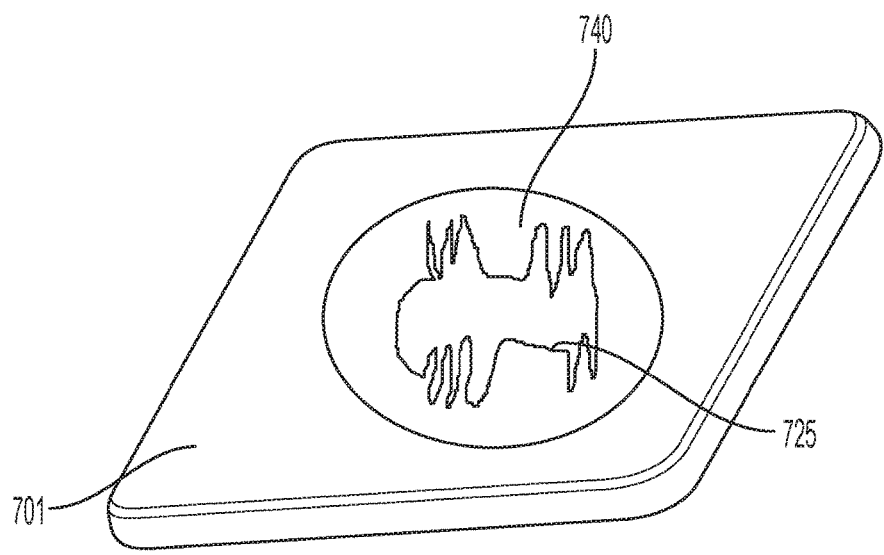
FIG. 13A is a top perspective view of another mold used for injection molding a rear surface of a component of a steering mechanism and having a conductive conduit therein held in place with a fastening assembly in the mold.
Figure 13B:
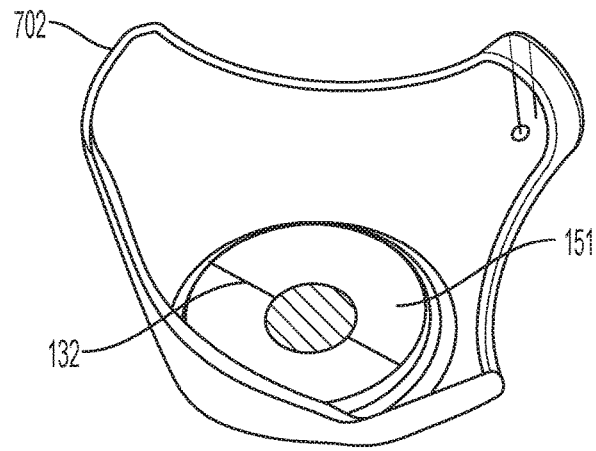
FIG. 13B is a top perspective view of a first mold used for injection molding a front surface of a component of a steering mechanism and having a conductive conduit therein as well as defined tear seams.

In one embodiment, a vehicle accessory control circuit (500) as shown in FIG. 15 may include a processor (502) electrically connected to a power source (510) and a memory (504), the processor executing computer readable instructions stored on the memory to configure the accessory control circuit and an accessory control output. The control circuit includes at least one capacitive touch assembly (100) having an electrically conductive conduit (see, e.g., FIG. 1, Ref. 175; FIG. 6 Ref. 225; or FIG. 12 Ref. 725) shielded by a portion (FIG. 15B, Ref. 151; FIG. 15C, Ref. 210) of a steering mechanism of the vehicle. The conductive conduit may be a conductive layer as shown in FIG. 15B, a wire conduit and similar conductors of FIG. 6, or a polymeric film having conductive circuits therein as shown in FIG. 5. The capacitive touch assembly (100) is connected to the power circuit (510) and the processor (502) such that the conduit is configured to transmit a capacitance input data signal to the processor to adjust the accessory control output as described above. Numerous data connections including wired and wireless transmission and appropriate communications circuitry would be included but are not shown in FIG. 15.

The shielding of the conductive conduit (FIG. 1, Ref. 175; FIG. 6 Ref. 225; or FIG. 12 Ref. 725) allows for particular components already present in a steering mechanism (110) to serve as an upper, or exposed, area that a user accesses in regard to a capacitive touch assembly (100). As shown in FIG. 15, the control circuit of this disclosure allows for a user to access the circuit and cause a capacitive response that is transmitted to the processor for proper output. The capacitive touch assembly, therefore, has an upper region (or outer shell/layer) (FIG. 15B, Ref. 157; FIG. 15C, Ref. 257) that the user touches to initiate a control signal sent to the processor (502). The portion (151) of a steering mechanism (110) that shields the conductor (225, 275) in the capacitive touch assembly (100) may be any region of the steering mechanism that is accessible to touch by the user as explained in regard to FIG. 3.

As shown in FIG. 15B, the portion of the steering assembly shielding the electrical conduit (225, 275, or 725) may include a proximate face (157) and a remote face (167), and the remote face is between the conduit and the proximate face. The conduit may be affixed to the remote face (167) of the shielding portion by an adhesive or a mechanical fastener. The proximate face is accessible to touch by a touch object (150) inducing or at least affecting a capacitance about the conductor. The outer portion (151) shielding the conduit could be a covering on a bezel (117) connected to the steering mechanism (110). A vehicle accessory control circuit may be connected as a touch sensor (190) button on the bezel (117).

In another embodiment, an air bag cover (130) connected to the steering mechanism (110) serves as the outer layer (FIG. 15B, Ref. 151) of the conductive touch assembly (100). Other embodiments place the conductive touch assembly in a steering wheel grip (112) connected to the steering mechanism. The portion (151) shielding the conduit comprises a material selected from the group consisting of leather, textiles, fabrics, plastic, metal, metal coatings, and chrome plating. The conduit (225, 275, 725) may be any conductor including but not limited to a wire, a wire mesh, a patterned coating, a conductive polymer, a metal coating, carbon nanobud assemblies, carbon nanotube assemblies, and a printed circuit assembly.

In all embodiments of this disclosure, the capacitive touch assembly may optionally be stationary in its position on the steering mechanism and may be a rigid assembly sending a control signal to the processor from a fixed position.

In another embodiment, the capacitive touch assembly (100) includes films that may incorporate conductive circuits therein. The films may incorporate conductive carbon that establishes a conductive circuit through the film (275) and to the processor (502). The film as shown in FIG. 5, Ref. 275 may be made of a polymer suitable for injection molding. In this regard, the film may have a select melting temperature characteristic, a select softening temperature characteristic, or bend radii within ranges suitable for an application. In one non-limiting example, the bend radius may be between 1 mm and 5 mm. In other embodiments, the bend radius may be between 2 mm and 4 mm. In one embodiment, the bend radius is 3 mm.

In this embodiment utilizing a film based conductive layer (275), the vehicle accessory control circuit includes a processor (500) electrically connected to a power source (510) and a memory (504), the processor executing computer readable instructions stored on the memory to configure the accessory control circuit and an accessory control output. The control circuit includes at least one capacitive touch assembly (100) coupled to a steering mechanism (110) of the vehicle, the capacitive touch assembly including a polymer layer (FIG. 5, Ref. 270) and an electrically conductive conduit (275) at least partially encased within the polymer layer (275) and connected at opposite ends to the power source and the processor such that said conduit transmits a capacitance input data signal to the processor to adjust the accessory control output.

In another embodiment, the vehicle accessory control circuit (500) includes a processor (502) connected to a power source (510) and a memory (504), the processor executing computer readable instructions stored on the memory to configure the accessory control circuit. The circuit incorporates at least one capacitive touch assembly (110) coupled to a steering mechanism (110) of the vehicle, the capacitive touch assembly transmitting a capacitance input data signal to the processor. In this embodiment, shown in FIG. 15C, the capacitive touch assembly utilizes an additional touch layer (210) extending over at least one conductive layer (225, 275, 725), such that the touch layer (210) is exposed on an outer surface (257) opposite the conductive layer. A typical shield layer (151) which is a component of the actual steering mechanism (110) (e.g., a finishing layer on the steering wheel) may provide a finish along the edges of the capacitive touch assembly. The conductive layer (225, 275, or 725) is in electronic communication with the power source and the processor and conducts the capacitance input data signal from the capacitive touch assembly to the processor to adjust an accessory control output.

The touch layer (210) may be flexible or rigid to touch, and in some embodiments, the touch layer (210) may have a defined thickness that is suitable to control the capacitive response of the underlying conductor (225, 275, 725). As one non-limiting example, the touch layer (210) may be within a range of 1 to 5 millimeters thick.

Figure 4:
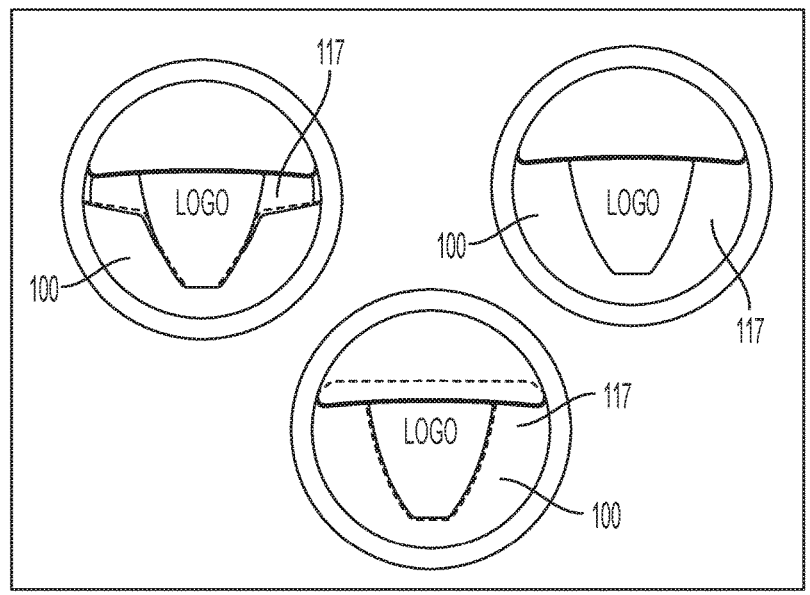
FIG. 4 is a front plan view of a series of capacitive touch assemblies of FIG. 3 in respective locations on a steering mechanism as described herein.
Figure 7:
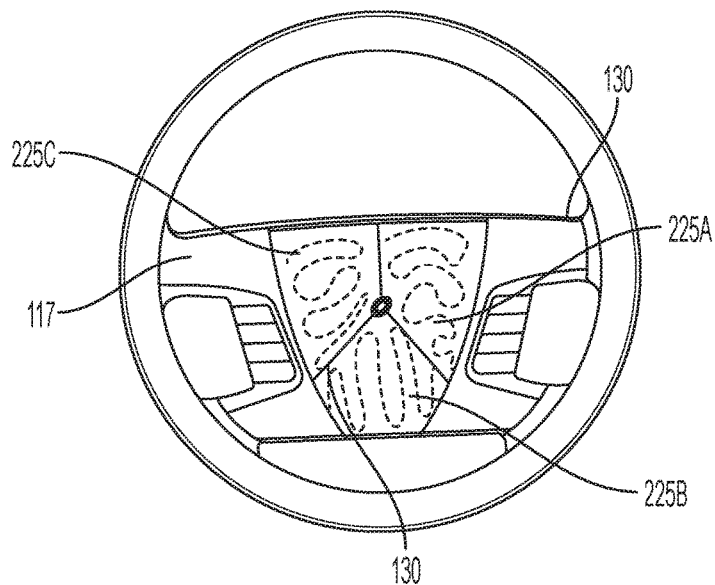
FIG. 7 is a front plan view of a steering mechanism as described herein incorporating a conductor defining respective capacitive touch zones within tear seams of a driver air bag cover for controlling respective vehicle accessory system outputs.

In all embodiments described herein, the capacitive touch assembly (100) may be configured so that the conductive conduit (225, 275, 725) is assembled in different zones as shown in the figures accompanying this description. In FIG. 2A the zones are established with respective capacitive touch assemblies (100A, 100B, 100C) positioned for particular kinds of access with a user's hand, thumb, or palm as illustrated in FIGS. 3-4. In other embodiments, such as that of FIG. 6, a conductive conduit (225) may traverse various portions of a steering mechanism (110) to form zones as described above with particular outputs thereby associated with each zone. In FIG. 7, the zones are defined in part by the tear seams of a driver air bag cover (130).

In yet another embodiment, the vehicle accessory control circuit is part of a vehicle accessory actuation system. A vehicle accessory control circuit connects a vehicle accessory (e.g., a horn, a stereo, lighting, and the like) to a power source (510), a processor (502), and a memory (504), wherein the processor executes computer readable instructions stored on the memory to configure the vehicle accessory control circuit and a vehicle accessory output. The circuit includes at least one capacitive touch assembly (100) coupled to a steering mechanism (110) of the vehicle and transmits a capacitance input data signal to the processor (502), wherein the capacitive touch assembly, as shown in FIG. 15C, includes a touch layer (210) having a first side (267) and an exposed side (257) and at least one conductive layer (225, 275, or 725) coupled to the first side (267) of the touch layer (210) and in electronic communication with the power source and the processor. The conductive layer transmits a capacitance input data signal to the processor to adjust the vehicle accessory output. In this embodiment, an air bag module may be coupled to the steering mechanism, the air bag module having a cover (130) disposed within the perimeter of the steering mechanism, and the at least one capacitive touch assembly is disposed on the steering mechanism adjacent the cover. In this sense, the cover (130) may connect, at least in part, to the capacitive touch assembly (100), as a finishing shield as shown in FIG. 15C at Ref. 151. In one non-limiting example of this construction, the finishing shield (151) attached to the capacitive touch assembly (100) may be positioned proximate to, under, or even within a graphical emblem formed within or attached to the air bag cover. See, e.g., the emblem formed for the manufacturer logo of FIG. 14. For example, the vehicle manufacturer may choose to incorporate a logo, company name, or any brand identifying mark as an emblem that is visible on the steering mechanism. The capacitive touch assembly as described herein may be contiguous with and operable by touching that emblem to adjust the capacitive input data signal.

Figure 8:
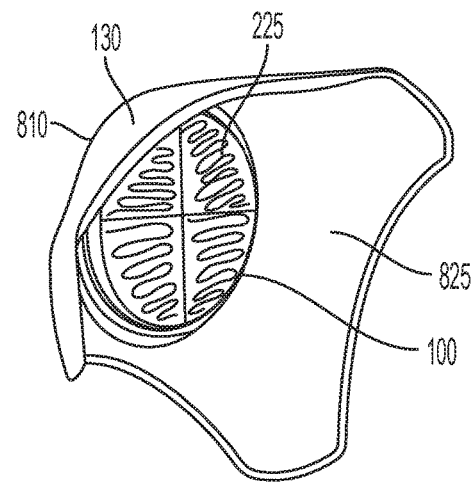
FIG. 8 is a rear perspective view of a driver air bag cover incorporating a conductive conduit as described herein.
Figure 9A:
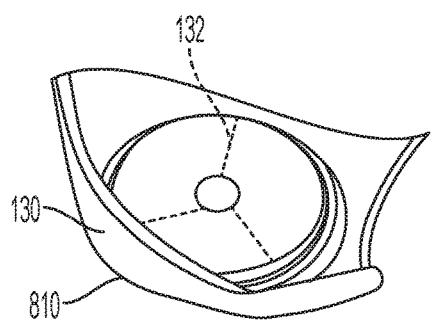
FIG. 9A is a front plan view of a driver air bag cover incorporating a conductive conduit as described in FIG. 8.
Figure 9B:
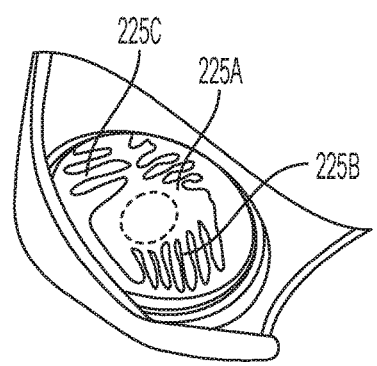
FIG. 9B is a rear plan view of a driver air bag cover according to FIG. 9A incorporating a conductive conduit as described herein.
Figure 10A:
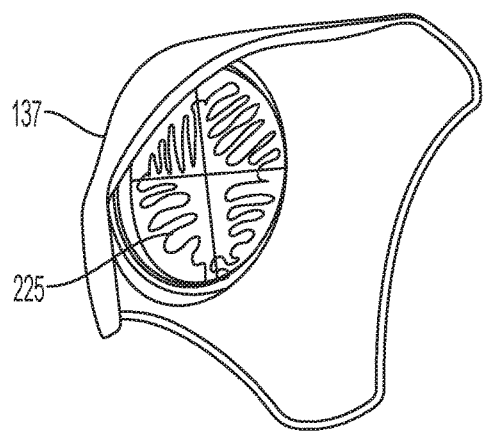
FIG. 10A is a front perspective view of a driver air bag cover according to FIG. 9A with an electrically conductive conduit exposed prior to shielding.
Figure 10B:
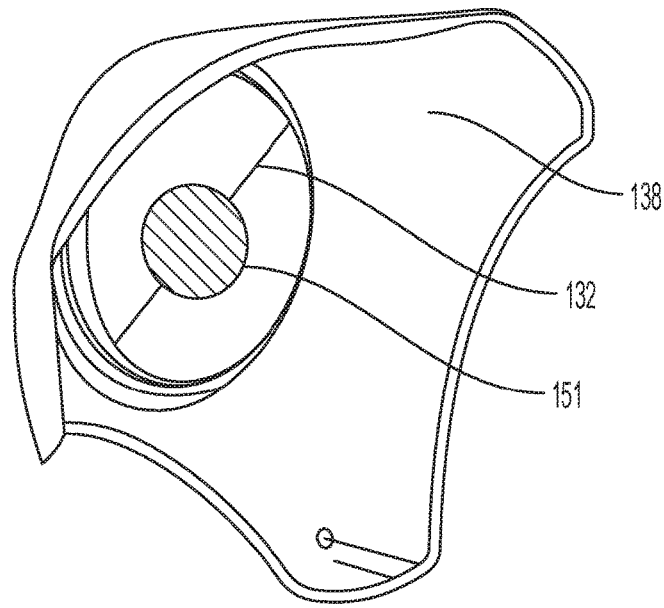
FIG. 10B is a rear perspective view of a driver air bag cover as described herein incorporating a conductor defining respective capacitive touch zones within tear seams of a driver air bag cover for controlling respective vehicle accessory system outputs.
Figure 10C:
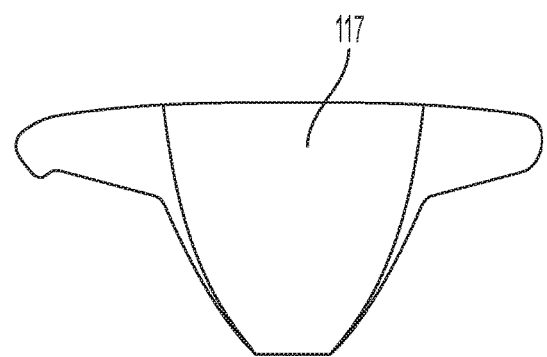
FIG. 10C is a front perspective view of a steering mechanism bezel utilizing a proximate surface of the bezel as a shield for a conductive conduit therein, as described below.
Figure 11A:
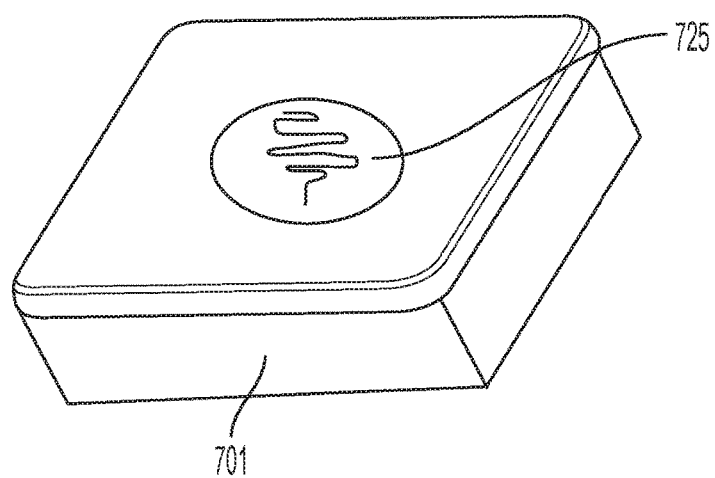
FIG. 11A is a top perspective view of a first mold used for injection molding a rear surface of a component of a steering mechanism and having a conductive conduit therein.
Figure 11B:
FIG. 11B is a top perspective view of a second mold used for injection molding a front surface of a component of a steering mechanism and having a conductive conduit therein.

In one method for constructing the vehicle accessory control system, the steps include placing a capacitive touch assembly (100) within an airbag module cover (130) between a proximate surface (810) and a remote surface (825) of the airbag module cover (130) as shown in FIG. 8, wherein the placement comprises a double shot injection molding process. The injection molding process may include injection molding the remote surface (825) of the cover into a shape, disposing the capacitive touch assembly (100) on an intermediate surface of the cover opposite the remote surface, and injection molding the proximate surface (810) of the cover over the intermediate surface and the capacitive touch assembly. See FIGS. 8-9.

In another embodiment, the vehicle accessory control system may include an accessory control circuit connecting a vehicle accessory system to a power source in a power circuit (510), a processor (502), and a memory (504), wherein the processor executes computer readable instructions stored on the memory to configure the accessory control circuit. At least one rigid capacitive touch assembly coupled to a steering mechanism of the vehicle transmits a capacitance input data signal to the processor. The capacitive touch assembly comprises a touch layer (210) having a first side (267) and an exposed side (257) and at least one conductive layer (225, 275, 725) connected to the first side (267) of the touch layer (210) and in electronic communication with the power source and the processor such that the conductive layer transmits a capacitance input data signal to the processor to adjust the vehicle accessory system. Capacitance between the conductive layer and a touching object in contact with the touch layer varies the capacitance input data signal transmitted to the processor to adjust the vehicle accessory system.

One method for constructing the vehicle accessory control system includes placing an electrically conductive conduit within a component of a steering mechanism between a proximate surface (157) and a remote surface (177) of the component as shown in FIG. 15B, wherein the placement may utilize a double shot injection molding process of injection molding the remote surface (177) of the component of the steering mechanism, disposing the electrically conductive conduit (225, 275, 725) onto an intermediate surface of the component opposite the remote surface, and injection molding a proximate surface of the component over the intermediate surface and the electrically conductive conduit.

Furthermore, various horn profiles may be set based on expected force signals, the number and spatial arrangement of force sensors within the driver air bag module, and expected and/or current vehicle conditions. In addition, tactile feedback profiles may be configured to correspond to the force magnitude, location, and/or duration of the force signals.

The touch sensors of this disclosure may be incorporated into certain implementations of accessories, such as a horn system in which only the driver air bag cover (130) is axially translatable to actuate the horn system via a lower sprung mass. This feature may allow the cover to be disposed closer to the base plate of the driver air bag module and reduces and/or eliminates the visible gap between the steering column and the cover of the driver air bag module.

Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with an instruction execution system, apparatus, or device.

A computer readable signal medium may include a propagated data signal with computer readable program code embodied therein, for example, in baseband or as part of a carrier wave. Such a propagated signal may take any of a variety of forms, including, but not limited to, electromagnetic, optical, or any suitable combination thereof. A computer readable signal medium may be any computer readable medium that is not a computer readable storage medium and that can communicate, propagate, or transport a program for use by or in connection with an instruction execution system, apparatus, or device.

Program code embodied on a computer readable medium may be transmitted using any appropriate medium, including but not limited to wireless, wireline, optical fiber cable, RF, etc., or any suitable combination of the foregoing.

Computer program code for carrying out operations for aspects of the present invention may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present invention are described below with reference to flowchart illustrations and/or block diagrams of methods, apparatus (systems) and computer program products according to implementations of the invention. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

The terminology used herein is for the purpose of describing particular implementations only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The implementation was chosen and described in order to best explain the principles of the invention and the practical application, and to enable others of ordinary skill in the art to understand the invention for various implementations with various modifications as are suited to the particular use contemplated.

The invention claimed is:

1. A vehicle accessory control circuit, comprising:
a processor electrically connected to a power source and a memory, the processor executing computer readable instructions stored on the memory to configure the accessory control circuit and an accessory control output;
at least one capacitive touch assembly coupled to a steering mechanism of the vehicle, the capacitive touch assembly comprising:
a polymer layer;
an electrically conductive conduit at least partially encased within the polymer layer and connected at opposite ends to the power source and the processor such that said conduit transmits a capacitance input data signal to the processor to adjust the accessory control output.

2. A vehicle accessory control circuit according to claim 1, wherein said accessory control output adjusts at least one of a horn output, a windshield wiper system, a cruise control system, an audio system, a video system, or a lighting system.

3. A vehicle accessory control circuit according to claim 1, wherein said electrically conductive conduit is an electrically conductive wire.

4. A vehicle accessory control circuit according to claim 1, wherein said electrically conductive conduit is a conductive wire mesh in said polymer layer.

5. A vehicle accessory control circuit according to claim 1, wherein said electrically conductive conduit is a printed circuit within said polymer layer.

6. A vehicle accessory control circuit according to claim 1, said capacitive touch assembly further comprising a touch layer having a first side and an exposed side, wherein the first side of said touch layer is coupled to said polymer layer, and said exposed side of said touch layer is positioned to receive a touching object, wherein capacitance between the conductive wire and the touching object in contact with the polymer layer varies the capacitance input data signal transmitted to the processor to adjust the accessory control output.

7. A vehicle accessory control circuit according to 1, wherein said polymer layer and said electrically conductive conduit define multiple zones having respective capacitive touch responses within said polymer layer, said zones having respective connections to said processor and providing respective capacitive touch input signals that adjust the accessory control output.

8. A vehicle accessory control circuit, comprising:
a processor connected to a power source and a memory, the processor executing computer readable instructions stored on the memory to configure the accessory control circuit;
at least one capacitive touch assembly coupled to a steering mechanism of the vehicle, the capacitive touch assembly transmitting a capacitance input data signal to the processor, the capacitive touch assembly comprising a touch layer extending over at least one conductive layer, such that the touch layer is exposed on an outer surface opposite the conductive layer; and
wherein the conductive layer is in electronic communication with the power source and the processor and conducts the capacitance input data signal, from the capacitive touch assembly to the processor to adjust an accessory control output, wherein capacitance between the conductive layer and a touching object in contact with the outer surface of the touch layer varies the capacitance input data signal transmitted to the processor to adjust the accessory control output.

9. A vehicle accessory control circuit according to claim 8, wherein said accessory control output adjusts at least one of a horn output, a windshield wiper system, a cruise control system, an audio system, a video system, and a lighting system.

10. A vehicle accessory control circuit according to claim 8 wherein said capacitive touch assembly comprises a wire positioned proximate the at least one conductive layer.

11. A vehicle accessory control circuit according to claim 8, wherein said capacitive touch assembly comprises a wire mesh positioned proximate the at least one conductive layer.

12. A vehicle accessory control circuit according to claim 8, wherein said capacitive touch assembly comprises a coating.

13. A vehicle accessory control circuit according to claim 8, wherein said capacitive touch assembly comprises a printed circuit within the at least one conductive layer.

14. A vehicle accessory control circuit according to claim 8, wherein said conductive layer comprises a flexible polymeric sheet having a plurality of carbon nanobuds defining a conductive path through said conductive layer.

15. A vehicle accessory control circuit according to claim 8, wherein the capacitance varies while the capacitive touch assembly remains stationary.

16. A vehicle accessory actuation system comprising:
a vehicle accessory control circuit connecting a vehicle accessory to a power source, a processor, and a memory, wherein the processor executes computer readable instructions stored on the memory to configure the vehicle accessory control circuit and a vehicle accessory output;
at least one capacitive touch assembly coupled to a steering mechanism of the vehicle and transmitting a capacitance input data signal to the processor, wherein the capacitive touch assembly comprises:
a touch layer having a first side and an exposed side; and
at least one conductive layer coupled to the first side of the touch layer and in electronic communication with the power source and the processor such that the conductive layer transmits a capacitance input data signal to the processor to adjust the vehicle accessory output;
wherein an air bag module is coupled to the steering mechanism, the air bag module having a cover disposed within the perimeter of the steering mechanism, and
wherein the at least one capacitive touch assembly is disposed adjacent the cover.

17. A vehicle accessory actuation system according to claim 16,
wherein the capacitance input data signal varies as a touch object contacting the exposed side of the touch layer changes the capacitance exhibited in the conductive layer, and
wherein corresponding changes in the capacitance input data signal are transmitted to the processor to adjust the vehicle accessory output.

18. A vehicle accessory actuation system according to claim 16, wherein the at least one conductive layer comprises a conductive path therein, said conductive path defined by at least one of a conductive wire, a wire mesh, a printed circuit, a coating, a carbon nanotube assembly, and a carbon nanobud assembly.

19. A vehicle accessory actuation system according to claim 16, wherein said at least one conductive layer comprises a conductive path through said conductive layer, and said conductive path traverses a section of the cover defined by tear seams in the cover, wherein said capacitive touch assembly comprises perforations that match said tear seams on said cover.

20. A vehicle accessory control circuit according to claim 16, wherein said accessory control output adjusts a horn output, a windshield wiper system, a cruise control system, an audio system, a video system, or a lighting system.

* * * * *